(12) United States Patent
Lin et al.

(10) Patent No.: US 6,929,887 B1
(45) Date of Patent: Aug. 16, 2005

(54) PRINTABLE ASSIST LINES AND THE REMOVAL OF SUCH

(75) Inventors: Burn-Jeng Lin, Hsinchu (TW); Ru-Gyn Liu, Yungkang (TW); Gue Wuu Hwang, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 29 days.

(21) Appl. No.: 10/125,215

(22) Filed: Apr. 18, 2002

(51) Int. Cl.[7] ............................. G01F 9/00; G03C 5/00
(52) U.S. Cl. ................................ 430/5; 430/394
(58) Field of Search ......................... 430/5, 394, 396

(56) References Cited

U.S. PATENT DOCUMENTS

| | | | |
|---|---|---|---|
| 5,242,770 A | 9/1993 | Chen et al. | 430/5 |
| 5,424,154 A * | 6/1995 | Borodovsky | 430/5 |
| 5,821,014 A | 10/1998 | Chen et al. | 430/5 |
| 6,109,775 A | 8/2000 | Tripathi et al. | 364/488 |
| 6,197,452 B1 | 3/2001 | Matumoto | 430/5 |
| 6,218,089 B1 | 4/2001 | Pierrat | 430/394 |
| 6,387,596 B2 * | 5/2002 | Cole et al. | 430/311 |

OTHER PUBLICATIONS

"Resolution Enhancement Techniques in Optical Lithography," by Alfred Kwok-Kit Wang, Tutorial Texts in Optical Engineering, Vol. TT47, SPIE Press, Copyright 2001.

* cited by examiner

Primary Examiner—S. Rosasco
(74) Attorney, Agent, or Firm—Thomas, Kayden, Horstemeyer & Risley

(57) ABSTRACT

A new method of applying FSAF is provided that optimizes the distribution of the spatial frequency and the unification of the photolithographic exposure level. The FSAF are removed by an additional exposure, using a specially designed mask that contains erasing features at the location of the FSAF.

35 Claims, 12 Drawing Sheets

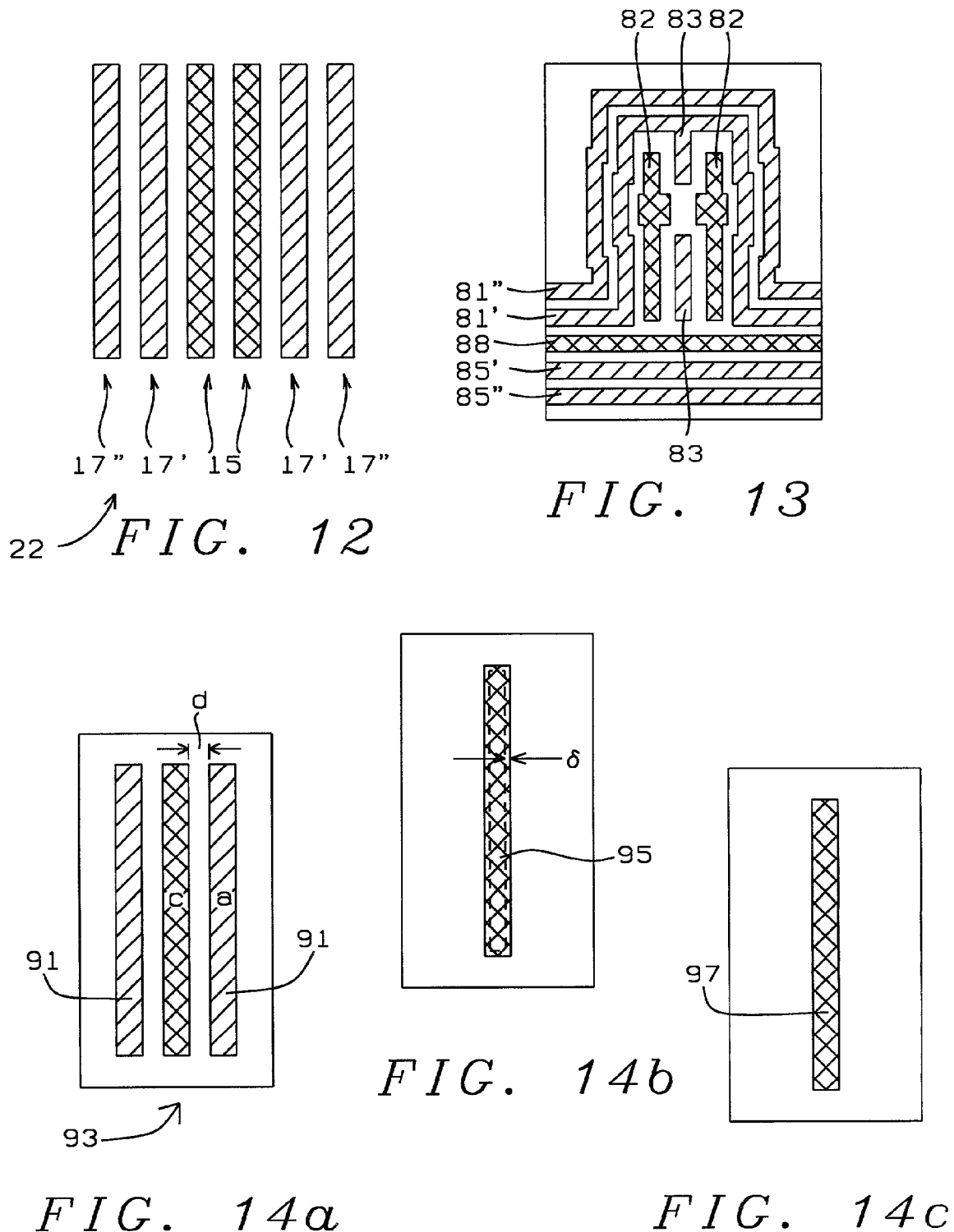

PRINTABLE ASSIST LINES AND THE REMOVAL OF SUCH

BACKGROUND OF THE INVENTION (1) Field of the Invention

The invention relates to the fabrication of integrated circuit devices, and more particularly, to a method to further improve the imaging of patterns that are used in photolithography by providing improved enhancement effects for sub-resolution lines that are added to a line pattern, to address issues of having insufficient space in order to add sub-resolution lines and issues of avoiding printing sub-resolution lines.

(2) Description of the Prior Art

The creation of semiconductor devices requires numerous interacting and mutually supporting disciplines. Addressed at this time are the disciplines that are required to create patterns on a semiconductor surface, such as the surface of a layer of photoresist or the surface of a semiconductor substrate.

Since device features are transposed from a mask onto a semiconductor surface using photolithographic imaging processes, which requires the transfer of photo energy from a source to a target surface, it is to be expected that, for target features that are created in very close proximity to each other, the transfer of photo energy interacts for very closely spaced device features, most commonly interconnect lines having sub-micron spacing between adjacent lines. This interaction imposes limitations on the proximity of adjacent device features, these limitations are referred to as Critical Dimensions (CD) of a design and device layout. This CD is commonly defined as the smallest spacing or the smallest line width of an interconnect line that can be achieved between adjacent interconnect lines. This CD in current technology is approaching the 0.1 to 0.2 $\mu$m range.

The invention addresses the problems of insufficient resolution and depth of focus in imaging interconnect lines and the spacing that is provided between these lines. In past practices, these problems have been addressed by adding sub-resolution lines in combination with off-axis illumination. The latter improves depth of focus for closely packed lines. The sub-resolution scattering bars artificially produce close packing while the scattering bars are not being printed. The latter is due to the fact that the size of the scattering bars are below the resolution limit. This method is therefore limited by the small size of the scattering bars. Increasing the size of the scattering bars in order to enhance the resolution and depth of focus results in printing these assist features. An improved method is therefore required which addresses these issues and the issue of printing of assist features.

U.S. Pat. No. 5,1424,770 (Chen et al.) reveals a mask for reducing Proximity effects using leveling bars.

U.S. Pat. No. 5,821,014 (Chen et al.) shows an OPC method using scattering bars.

U.S. Pat. No. 6,218,089 (Pierrat), U.S. Pat. No. 6,197,452 (Matumoto), and U.S. Pat. No. 6,109,775 (Tripathi et al.) are related photo processes using extra shapes to improve resolution.

SUMMARY OF THE INVENTION

A principle objective of the invention is to provide a method of photolithographic exposure using Full Size Assist Features (FSAF) in order to optimize the spatial frequency and the unification of the photolithographic exposure level.

Another objective of the invention is to narrow the range of the distribution of the line-to-space ratio in a given mask pattern that is used for photolithographic exposure.

In accordance with the objectives of the invention a new method of applying FSAF is provided that optimizes the spatial frequency and the unification of the photolithographic exposure level. The FSAF are removed by an additional exposure, using a specially designed mask that contains erasing features at the location of the FSAF.

BRIEF DESCRIPTION OF THE DRAWINGS

FIG. 12 shows a top view of two packing features per side, as applied in the top view shown in FIGS. 2a through 2c.

FIG. 13 shows a top view of a two-dimensional double Full Size Assist Feature (FSAF).

FIGS. 14a through 14c show a top view of an unpacking mask, required for the desired features as shown in top view in FIGS. 1a through 1c.

DESCRIPTION OF THE PREFERRED EMBODIMENTS

Figure 1C:
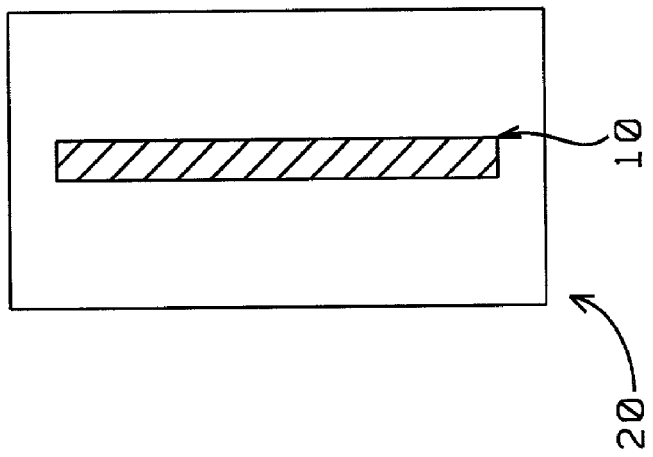
FIGS. 1a through 1c show a top view of the Printable Assist and the Removal (PAR) implementation, applied to enhance an isolated line.

As has been previously highlighted, close line spacing in the range of a line-width to line-spacing (L/S) ratio of 1:1 is difficult to achieve for devices having resolution-limiting size, resulting in a narrow latitude of exposure and a small depth of focus or both. To correct this problem, a well-known method is to use off-axis illumination, in the form of annular, quadruple or dipole configurations. A limitation of this method is that the location of the ring, quadruples or dipoles can be optimized only for a special frequency in the object. For example, only the image of pairs of 1:1 spaced lines (line-width to line-spacing ratio) can be optimized. In this case of optimization, lines with a L:S=1:2 ratio will benefit less from this optimization scheme, lines that are spaced further apart benefit even less. This scheme can be applied to lines with for instance L:S=1:2 but this optimization is achieved at the expense of lines with higher and lower ratios of L:S.

A frequently applied method that is applied to improve the imaging of patterns with a larger pitch (distance between adjacent images) is to add sub-resolution lines where space is available for such addition. These sub-resolution lines are not printable but they contribute spatial frequencies, creating a condition of exposure that is close to an optimized condition. The sub-resolution lines also move the exposure level of the less optimized patterns closer to the exposure level of the optimized patterns. However, the enhancement effects of these sub-resolution lines are still significantly less effective than the full size printable lines. Finally, the sub-resolution lines may still be printed in cases where careful control is not applied to the use of these sub-resolution lines.

The invention provides for application of a Full Size Assist Feature (FSAF) pattern, the FSAF is used to maximize the contribution (by the FSAF) to spatial frequency and to achieve unification of the exposure level of the desired feature. The FSAF exposure is removed by application of an additional exposure, using a specially designed mask that contains erasing features of the surface regions where the FSAF are located.

The invention therefore provides for:
- a first mask that comprises the desired features in addition to full-size assist features
- a second mask that comprises unpacking features that have shapes that are similar to (follow the contours of) the full-size assist features
- a second mask that comprises unpacking features that have shapes that are similar to the desired features
- the unpacking features of the second mask of the invention have dimensions that are slightly larger than the corresponding dimensions of the full-size assist features provided on the first mask
- the full-size assist features are placed on the first mask of the invention at a measurable distance from the desired features; this measurable distance varies between about 0.5 and 3.0 times the width of the desired minimum feature the size of the full-size assist feature on the first mask of the invention has a width that is between about 0.5 and 3 times the width of the minimum desired feature
- the measurable distance of the full-size assist features on the first mask of the invention is determined in accordance with a combination of desired feature size or width, the shape of the desired feature and the location of the desired feature within the exposure pattern; this determination is aimed at creating the best image possible, that is at optimizing image performance, and
- the size of the full-size assist features on the first mask of the invention is determined in accordance with a combination of desired feature size or width, the shape of the desired feature, and the location of the desired feature within the exposure pattern; this determination is aimed at creating the best image possible, that is at optimizing image performance.

Keeping in mind the above listed aspects of the mask of the invention, it can be stated that a key aspect of the invention is to narrow the range of the ratio of Line-Width to Line-Spacing (L:S) for a given pattern that has been created on the surface of a mask. In view of the fact that it is typically not feasible to limit the circuit designer to a range of L:S ratios, this ratio can vary between 1:1 and 1:infinity, that is between equal line-width to line-spacing to isolated lines. By adding the FSAF, the range in the ratio L:S can be significantly narrowed, making off-axis illumination extremely effective.

While the above explanation has essentially focused on using a second pattern that comprises full-size assist features (FSAF), it must be realized that the second mask is not limited to comprising full-size assist features only but may also comprise small-size assist features, also referred to as sub-resolution assist features (SRAF).

The conventions that are provided by the invention are next illustrated using the drawings that are part of this application.

Figure 1B:
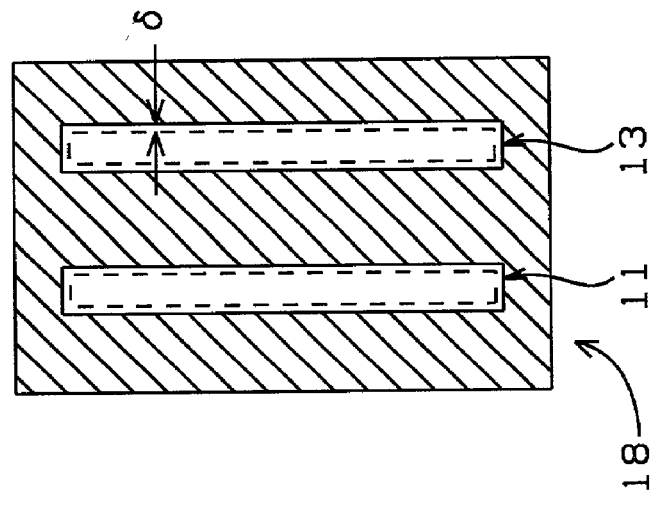
Figure 1A:
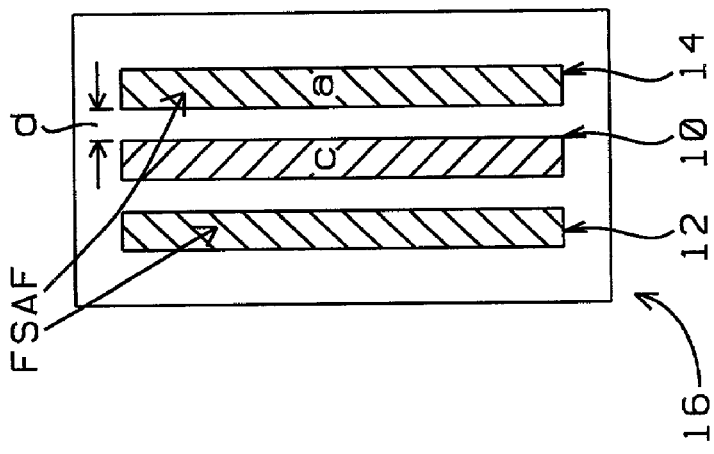

FIGS. 1a through 1c show an enhancement of an isolated line. By adding one FSAF to each side of the desired isolated line at a distance "d" from either edge of the line, new spatial frequency components are created. The most prominent of these new spatial frequency components is the first order component of the newly formed pitch $p=c/2+a/2+d$, where "c" is the width of a given feature of the circuit design and "a" is the width of the FSAF. Preferably $a=c$, in which case $p=c+d$. The separation "d" is selected such that optimum results are obtained for a L:S ratio with a given off-axis illumination condition. These optimum results are most beneficially obtained for ratios of L:S within the range of between 1:1 and 1:2. Alternately, the value for "d" and the off-axis illumination condition are mutually adjusted until the best imaging performance is achieved, that is the best performance as measured by Depth Of Focus (DOF), exposure latitude and exposure-defocus area.

For the drawings that are shown, values of $d=a$ and $c=a$ have been selected as examples. The principles that are explained using these selections equally apply for different selections of these values or their ratios. FIGS. 1a through 1c show a top view of an image where two FSAF 12 and 14 have been placed, one FSAF on each side of an isolated line 10.

Shown in top view in FIGS. 1a through 1c are:
- 16, FIG. 1a, the image on the surface of the packed mask; with packed mask is indicated the mask that contains an image of both the desired (or final) image and an image that will be provided in an unpacking mask;
- 18, FIG. 1b, the image provided on the surface of the unpacking mask;
- 20, FIG. 1c, the final image that is created by first exposing with the packed mask 16, after which the same surface is exposed with the unpacking mask 18; this exposure with the unpacking mask 18 is performed such that the unpacking images 11 and 13 are aligned with the images 12 and 14 of the packed mask.

The exposure sequence that has been highlighted using FIGS. 1a through 1c makes clear that the stated method of the invention is being performed. To review this method: a Full Size Assist Feature provides a FSAF pattern 18, the FSAF pattern 18 is used to maximize the contribution by the FSAF pattern 18 to spatial frequency and to achieve unification of the exposure level of the desired feature, that is exposure using the mask 16. The FSAF exposure 12 and 14 is removed by application of an additional exposure, using the specially designed unpacking mask 18 that contains erasing features 11 and 13 of the surface regions 12 and 14 where the FSAF are located.

With the above detailed description of the principle that is provided by the invention, the remaining figures can be highlighted in detail.

Figure 2C:
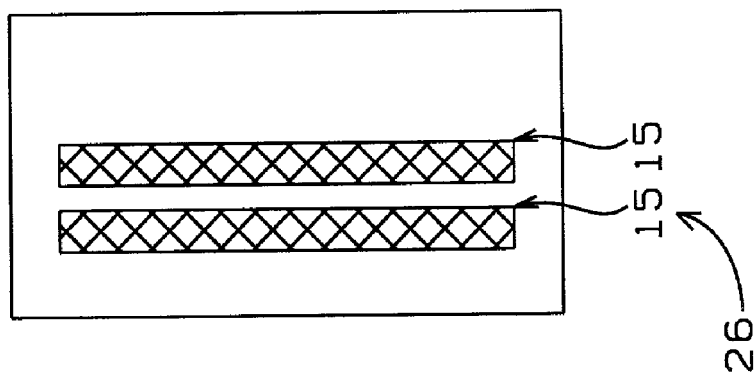
FIGS. 2a through 2c show a top view of the PAR implementation, applied to enhance a line-to-spacing (L/S) ratio of 1:1.
Figure 2B:
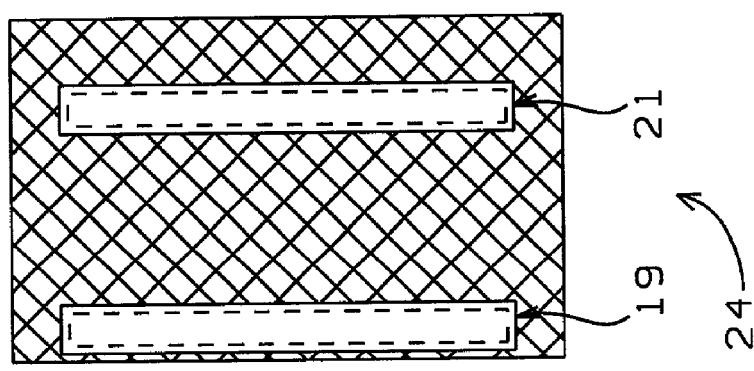
Figure 2A:
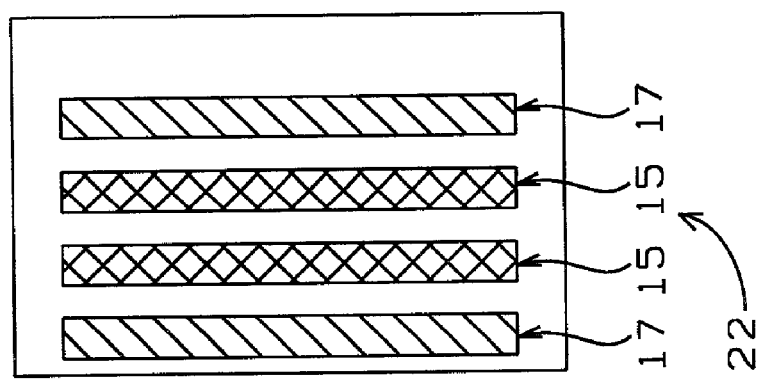

FIGS. 2a through 2c show a top view of the PAR implementation, applied to enhance a line-to-spacing (L/S) ratio of 1:1, as follows:
- 22, FIG. 2a, the image on the surface of the packed mask; two FSAF images 17 have been placed, one FSAF one each side of two desired or final lines 15;

24, FIG. 2b, the image on the surface of the unpacking mask; two unpacking images 19 and 21 have been provided in the surface of the unpacking mask 24;

26, FIG. 2c, the final image that is created by first exposing with the packed mask 22, after which the same surface is exposed with the unpacking mask 24; this exposure with the unpacking mask 24 is performed such that the unpacking images 19 and 21 are aligned with the images 17 of the packed mask 22. This allows pattern 19/21 to maximize the contribution to spatial frequency and to achieve unification of the exposure level of the desired feature, that is the final image 15 shown in top view in image 26.

Figure 3C:
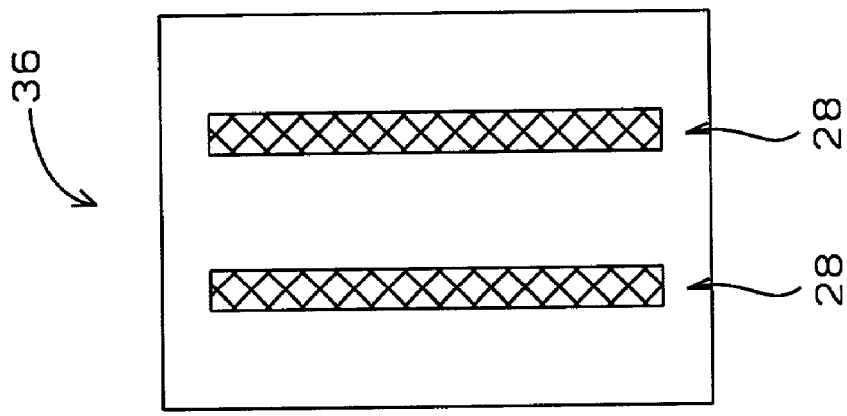
FIGS. 3a through 3c show a top view of the PAR implementation, applied to enhance a L/S ratio of 1:3.
Figure 3B:
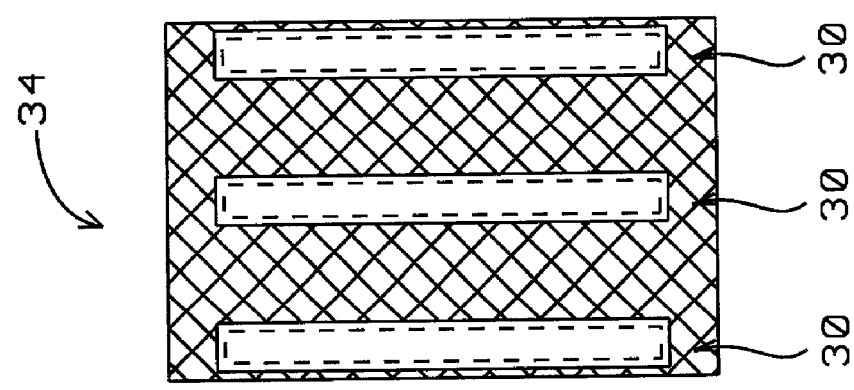
Figure 3A:
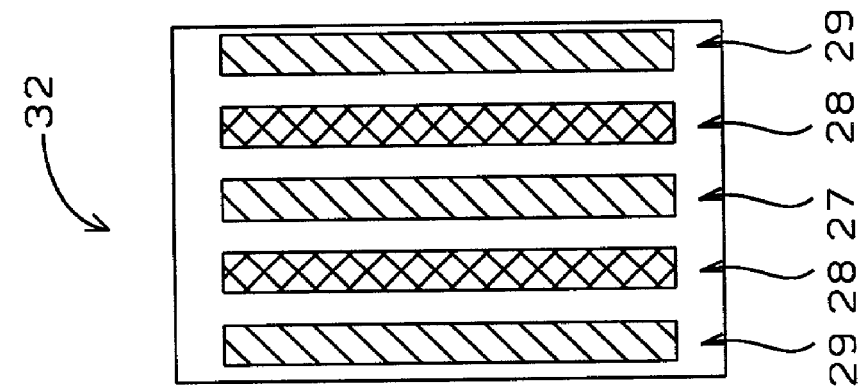

FIGS. 3a through 3c show a top view of the PAR implementation, applied to enhance a L/S ratio of 1:3. In FIGS. 3a through 3c, with a separation equal to "3c" between two desired features, one FSAF pattern is added between these two desired features, two additional FSAF patterns are added to the outside of the two desired features.

FIGS. 3a through 3c show in top view:

32, FIG. 3a, the image on the surface of the packed mask; one FSAF image 27 has been placed between two desired features 28, two additional FSAF patterns 29 have been added to the outside of the two desired features;

34, FIG. 3b, the image on the surface of the unpacking mask; three unpacking images 30 have been provided in the surface of the unpacking mask 34;

36, FIG. 3c, the final image that is created by first exposing with the packed mask 32, after which the same surface is exposed with the unpacking mask 34; this exposure with the unpacking mask 34 is performed such that the unpacking images 30 are aligned with the images 27 and 29 of the packed mask 22. This allows pattern 30, of image 34 to maximize the contribution to spatial frequency and to achieve unification of the exposure level of the desired feature, that is the final image 28 shown in top view in image 36.

Figure 4C:
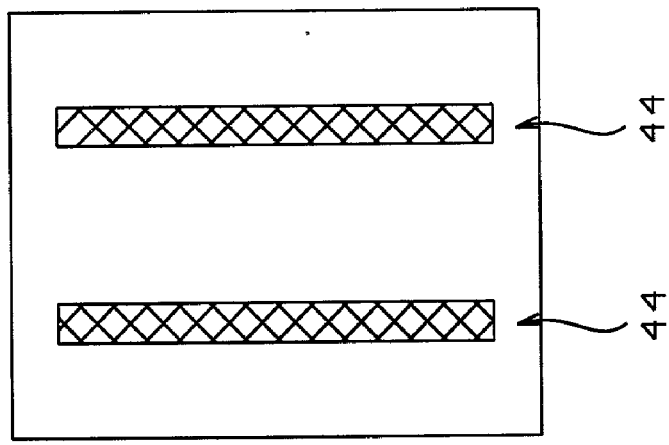
FIGS. 4a through 4c show a top view of the PAR implementation, applied to enhance a L/S ratio of 1:4.1.
Figure 4B:
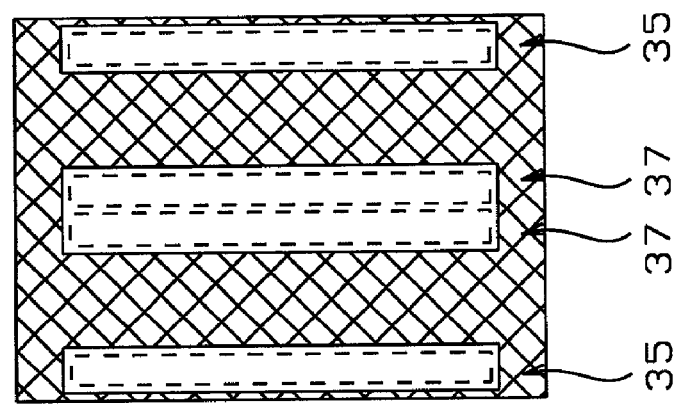
Figure 4A:
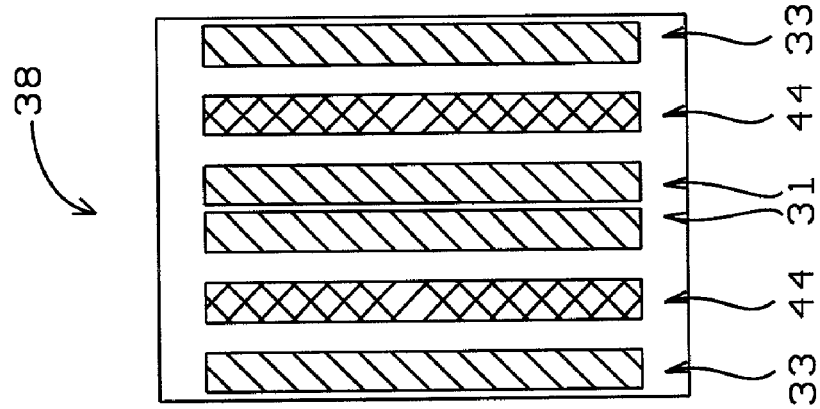

FIGS. 4a through 4c show a top view of the PAR implementation, applied to enhance a L/S ratio of 1:4.1. In FIGS. 4a through 4c, with a somewhat larger separation between the lines of the desired image (L/S 1:4.1), two FSAF patterns can be added between the desired features. Since these two added FSAF patterns are in close proximity, these two patterns can be combined into one pattern. Two additional FSAF patterns are added to the outside of the two desired features.

FIGS. 4a through 4c show in top view:

38, FIG. 4a, the image on the surface of the packed mask; FSAF images 31, combined into one larger image, have been placed between two desired features 44, two additional FSAF patterns 33 have been added to the outside of the two desired features; 40, FIG. 4b, the image on the surface of the unpacking mask; unpacking images 37, combined into one image and two unpacking images 35 have been provided in the surface of the unpacking mask 40;

42, FIG. 4c, the final image 44 that is created by first exposing with the packed mask 38, after which the same surface is exposed with the unpacking mask 40; this exposure with the unpacking mask 40 is performed such that the unpacking images 35/37 are aligned with the images 33/31 respectively of the packed mask 38. This allows patterns 33/37, of image 40 to maximize the contribution to spatial frequency and to achieve unification of the exposure level of the desired feature, that is the final image 44 shown in top view in image 42.

Figure 5C:
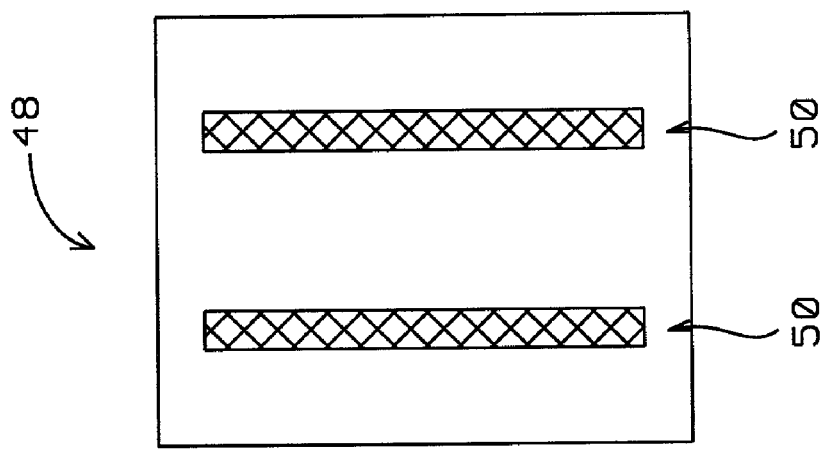
FIGS. 5a through 5c show a top view of the (wide) PAR implementation, applied to enhance a L/S ratio of 1:3.9.
Figure 5B:
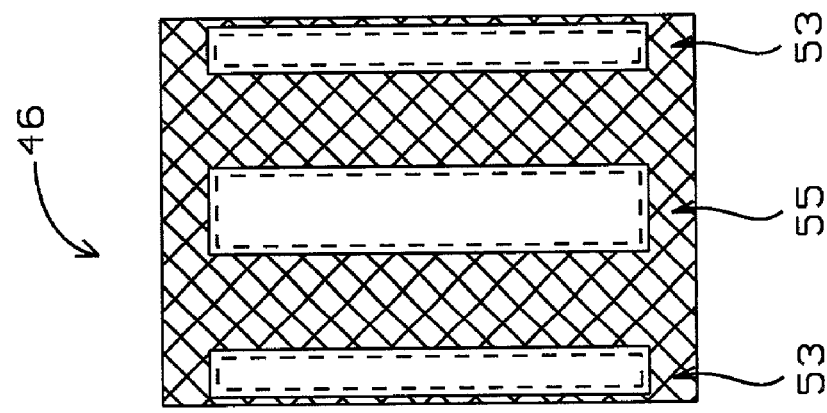
Figure 5A:
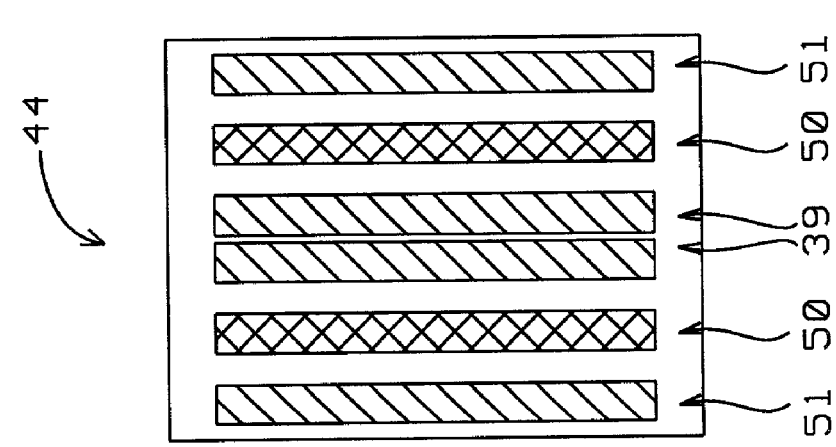

FIGS. 5a through 5c show a top view of the (wide) PAR implementation, applied to enhance a L/S ratio of 1:3.9. In FIGS. 5a through 5c, with a somewhat smaller separation between the lines of the desired image (L/S=3.9), two FSAF patterns are added between the desired features. Since these two added FSAF patterns are now in close proximity, these two patterns overlap for patterns where a distance of "d" is maintained between the edge of the FSAF pattern and the adjacent desired pattern. The pattern of two inserted two FSAF patterns can therefore combined into one pattern. Alternatively, one FSAF pattern may be applied whereby however the width of this one pattern is adjusted for optimum results of exposure as measured by DOF, exposure latitude and exposure/defocus range. This latter application is shown in top view in FIGS. 6a through 6b. Two additional FSAF patterns are added to the outside of the two desired features.

FIGS. 5a through 5c show in top view:

44, FIG. 5a, the image on the surface of the packed mask; FSAF images 39, combined into one larger image, have been placed between two desired features 50, two additional FSAF patterns 51 have been added to the outside of the two desired features;

46, FIG. 5b, the image on the surface of the unpacking mask; unpacking images 39, combined into one image 55 and two unpacking images 53, have been provided in the surface of the unpacking mask 46;

48, FIG. 5c, the final image that is created by first exposing with the packed mask 44, after which the same surface is exposed with the unpacking mask 46; this exposure with the unpacking mask 46 is performed such that the unpacking images 55/53 are aligned with the images 39/51 respectively of the packed mask 44. This allows patterns 53/55, of image 46 to maximize the contribution to spatial frequency and to achieve unification of the exposure level of the desired feature, that is the final image 50 shown in top view in image 48.

Figure 6C:
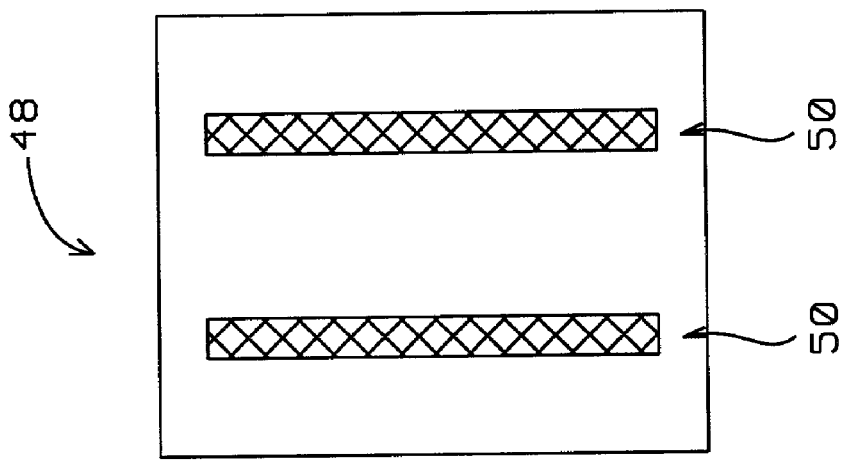
FIGS. 6a through 6c show a top view of the (narrow) PAR implementation, applied to enhance a L/S ratio of 1:3.9.
Figure 6B:
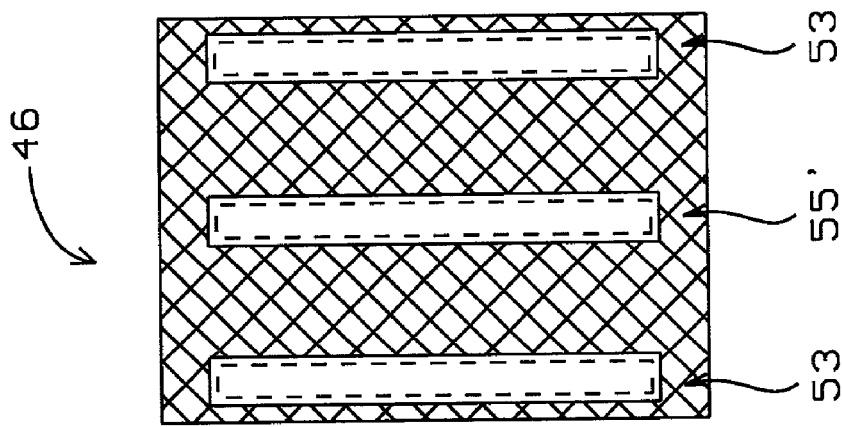
Figure 6A:
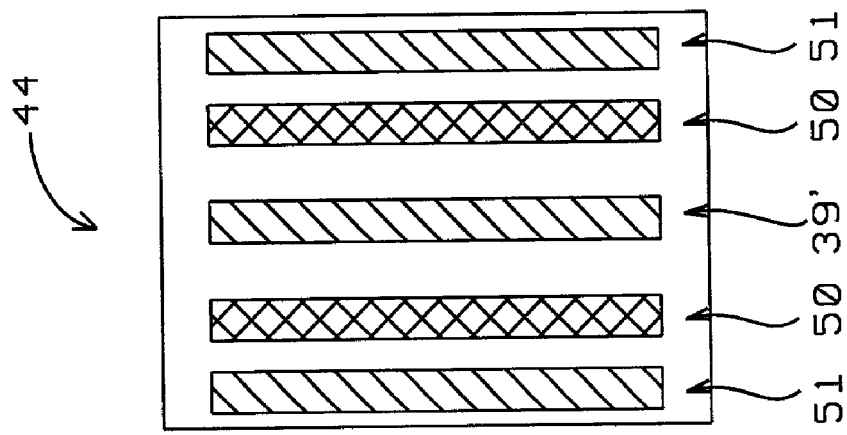

FIGS. 6a through 6c show a top view of the (narrow) PAR implementation, applied to enhance a L/S ratio of 1:3.9. In FIGS. 6a through 6c, the FSAF images 39 of FIG. 5a have been replaced with the one FSAF image 39', the unpacking image 55 of FIG. 5b has been replaced with the one unpacking image 55', as previously highlighted.

Figures 7A, 7B, 7C:
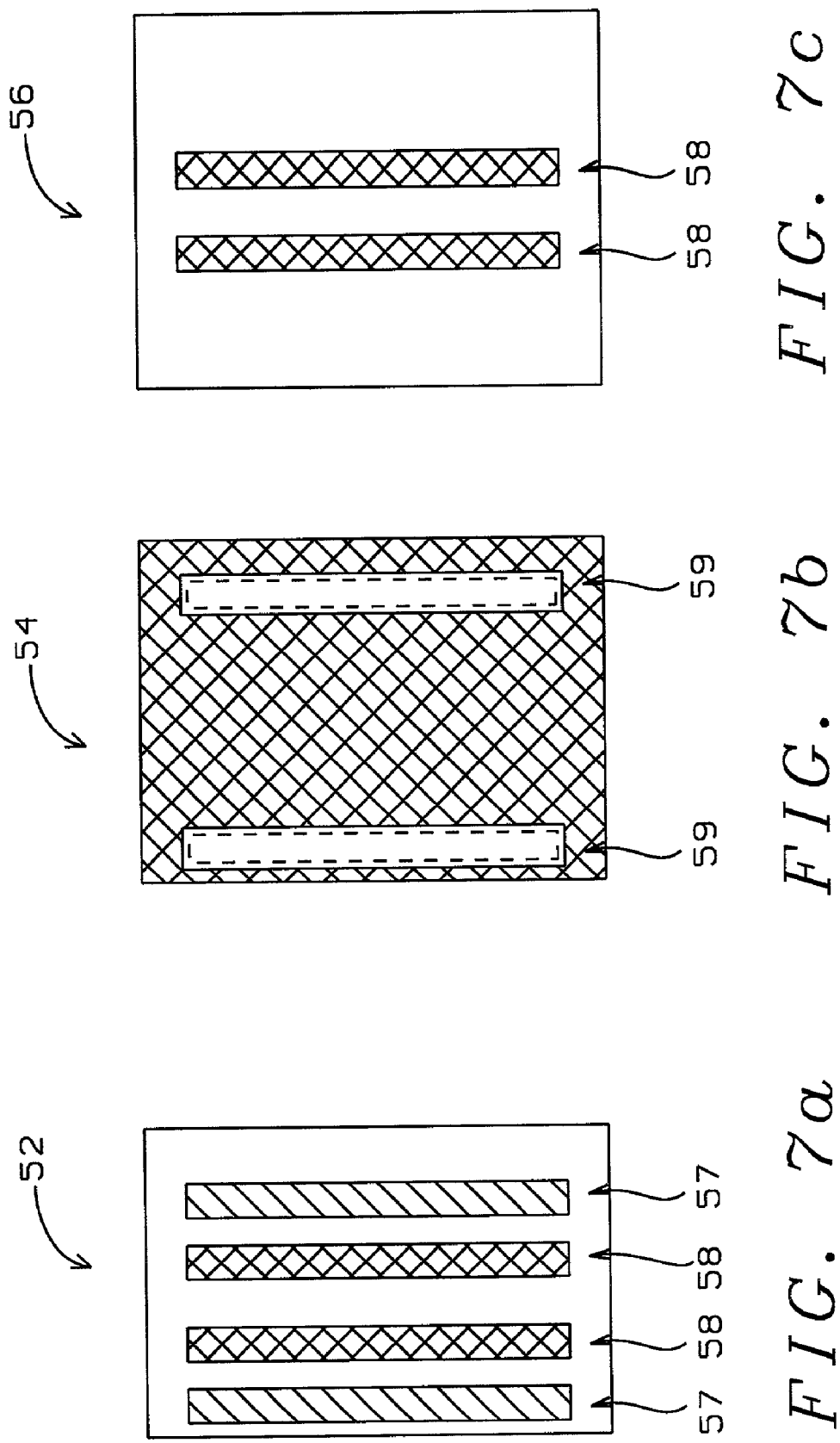
FIGS. 7a through 7c show a top view of the PAR implementation, applied to enhance a L/S ratio of 1:1.5.

FIGS. 7a through 7c show a top view of the PAR implementation, applied to enhance a L/S ratio of 1:1.5. In FIGS. 7a through 7c the distance between the desired features is between "1c" and "2c", L:S=1:1.5 For these cases, there is no room available between the features for the addition of a FSAF image which however still allows for the addition of FSAF images o the outside of the desired image.

FIGS. 7a through 7c show in top view:

52, FIG. 7a, the image on the surface of the packed mask; FSAF images 57 have been added to the outside of the two desired features 58

54, FIG. 7b, the image on the surface of the unpacking mask; unpacking images 59 have been provided in the surface of the unpacking mask 54;

56, FIG. 7c, the final image that is created by first exposing with the packed mask 52, after which the same surface is exposed with the unpacking mask 54; this exposure with the unpacking mask 54 is performed such that the unpacking images 59 are aligned with the images 57 of the packed mask 52. This allows patterns 59, of image 54 to maximize the contribution to spatial frequency and to achieve unification of the exposure level of the desired feature, that is the final image 58 shown in top view in image 56.

Figure 8C:
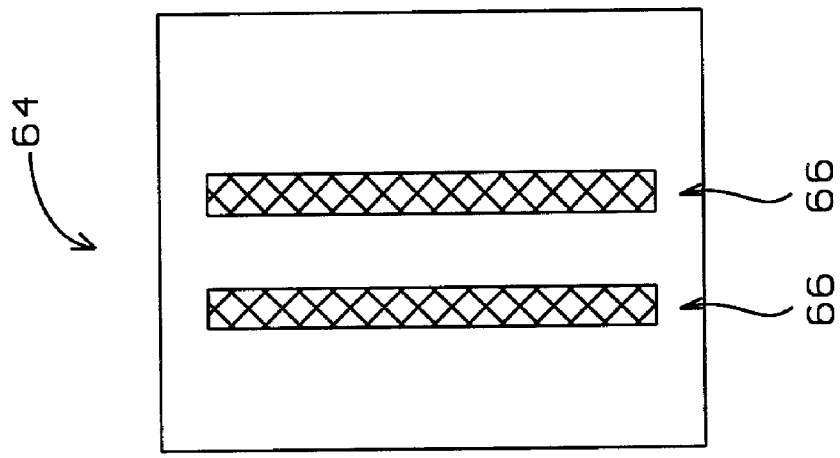
FIGS. 8a through 8c show a top view of the PAR implementation, applied to enhance a L/S ratio of 1:2.
Figure 8B:
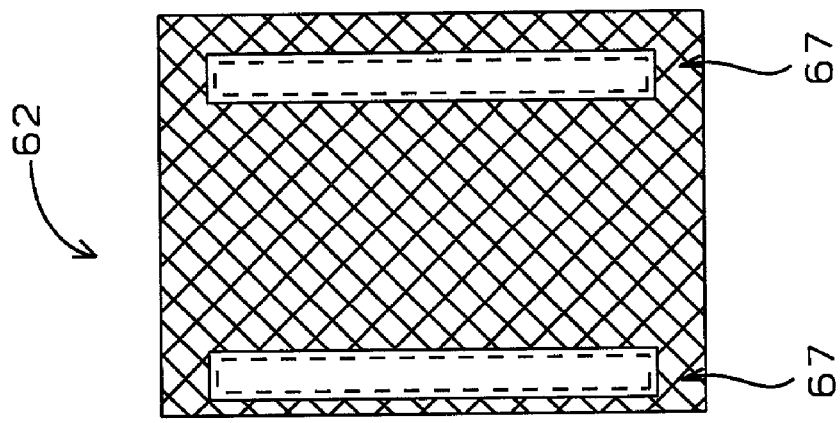
Figure 8A:
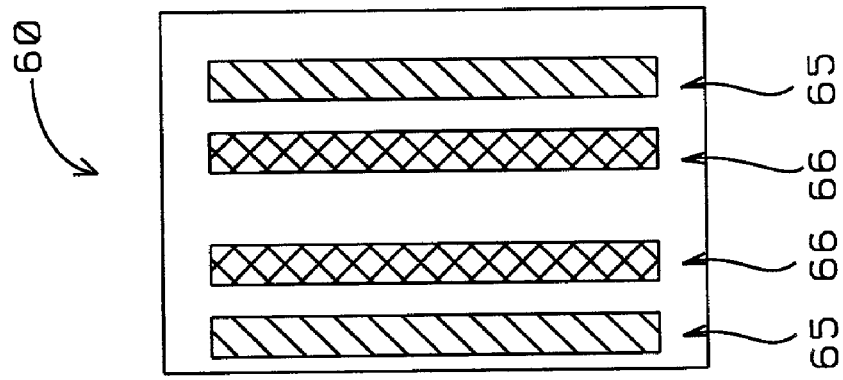

FIGS. 8a through 8c show a top view of the PAR implementation, applied to enhance a L/S ratio of 1:2. in FIGS. 8a through 8c the distance between the desired features is "2c", L:S=1:2. For this case, there is no room available between the features for the addition of a FSAF image which however still allows for the addition of FSAF images to the outside of the desired image.

FIGS. 8a through 8c show in top view:
- 60, FIG. 8a, the image on the surface of the packed mask; FSAF images 65 have been added to the outside of the two desired features 66
- 62, FIG. 8b, the image on the surface of the unpacking mask; unpacking images 67 have been provided in the surface of the unpacking mask 62;
- 64, FIG. 8c, the final image that is created by first exposing with the packed mask 60, after which the same surface is exposed with the unpacking mask 62; this exposure with the unpacking mask 62 is performed such that the unpacking images 67 are aligned with the images 65 of the packed mask 60. This allows patterns 67, of image 62 to maximize the contribution to spatial frequency and to achieve unification of the exposure level of the desired feature, that is the final image 66 shown in top view in image 64.

Figure 9C:
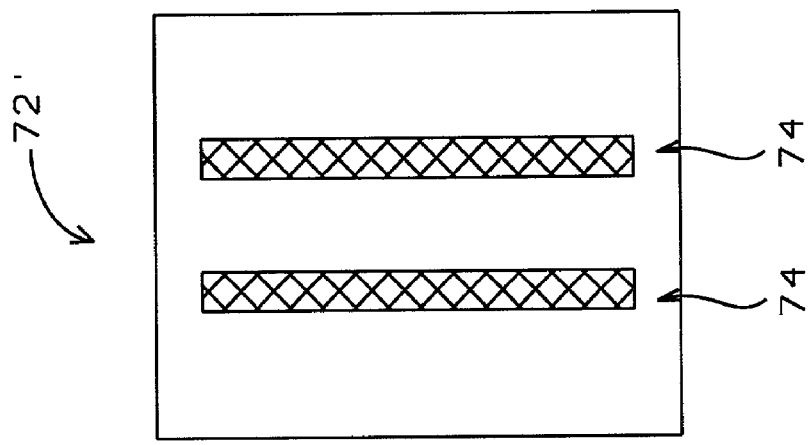
FIGS. 9a through 9c show a top view of the PAR implementation, applied to enhance a L/S ratio of 1:2.5.
Figure 9B:
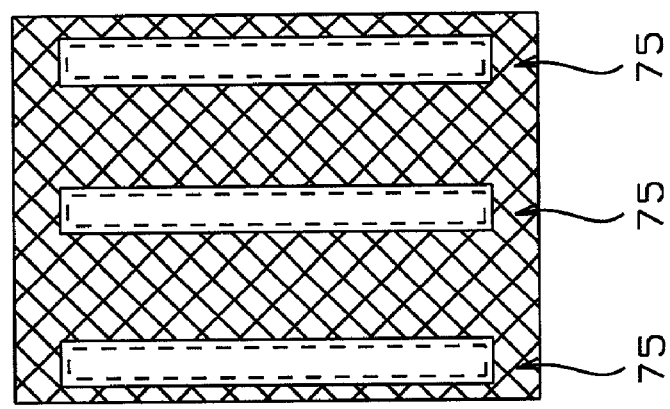
Figure 9A:
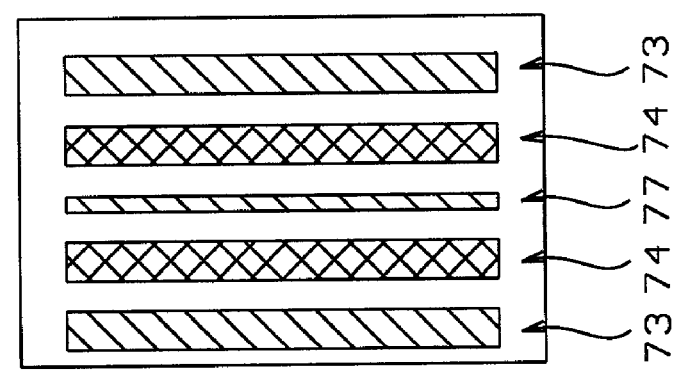

FIGS. 9a through 9c show a top view of the PAR implementation, applied to enhance a L/S ratio of 1:2.5. In FIGS. 9a through 9c the distance between the desired features is between "2c" and "2c", L:S 1:2.5. For this case, there is room available between the features for the addition of a FSAF image but the FSAF image in this case the value for "a" must be smaller than dimension "c" in order to maintain the value of parameter "d". Two FSAF images have been added to the outside of the desired image.

FIGS. 9a through 9c show in top view:
- 68, FIG. 9a, the image on the surface of the packed mask; one FSAF images 77 has been placed between two desired features 74, two additional FSAF patterns 73 have been added to the outside of the two desired features 74
- 70, FIG. 9b, the image on the surface of the unpacking mask; three unpacking images 75 have been provided in the surface of the unpacking mask 70;
- 72, FIG. 9c, the final image that is created by first exposing with the packed mask 68, after which the same surface is exposed with the unpacking mask 70; this exposure with the unpacking mask 70 is performed such that the unpacking images 75 are aligned with the images 73/77 of the packed mask 68. This allows pattern 75, of image 70 to maximize the contribution to spatial frequency and to achieve unification of the exposure level of the desired feature, that is the final image 74 shown in top view in image 72.

It is clear from the above that, for linear exposures, the descriptions that have been provided address conditions that are required for the implementation of the invention. Additional detail will be provided relating to non-linear or 2-D exposures in the following drawings.

Figure 10C:
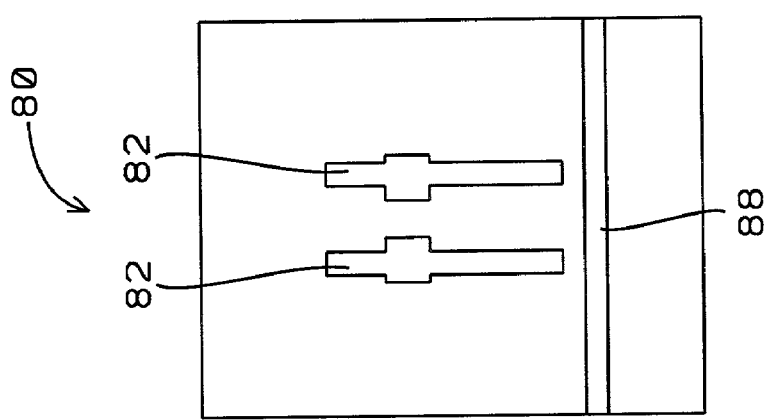
FIGS. 10a through 10c show a top view of the PAR implementation, applied to first two-dimensional features.
Figure 10B:
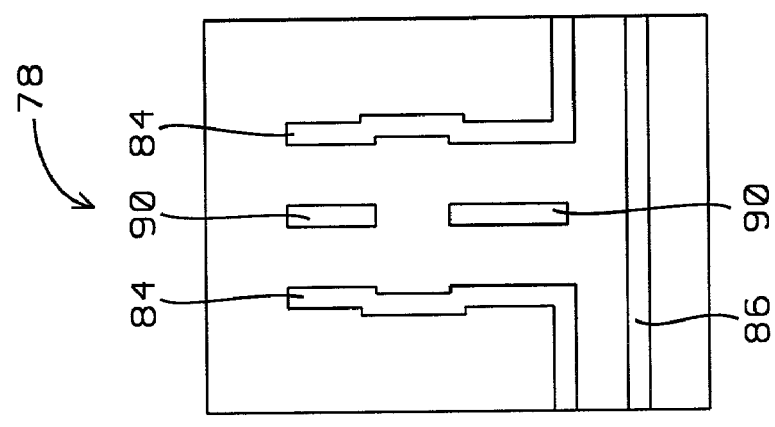
Figure 10A:
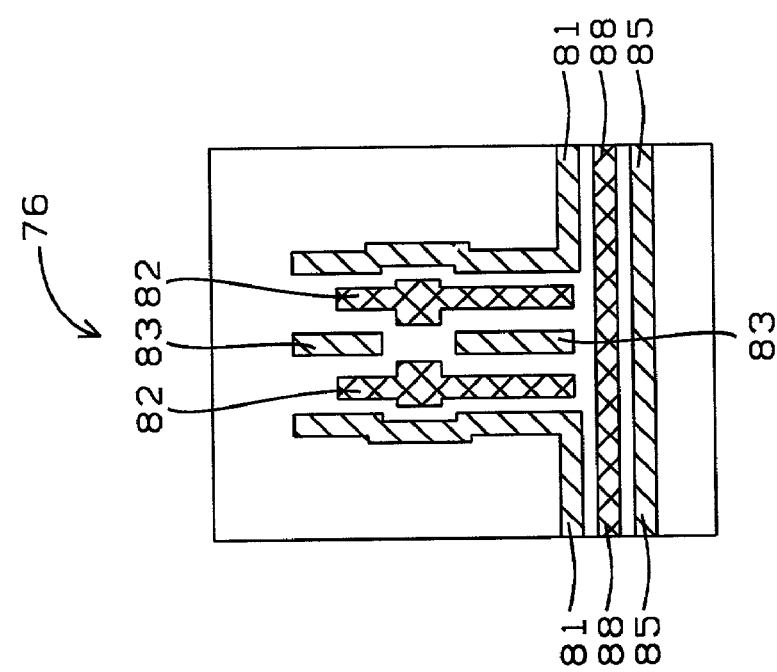

FIGS. 10a through 10c show a top view of the PAR implementation, applied to first two-dimensional features. FIGS. 10a through 10c show the top view of a typical layout for a polysilicon gate electrode. FSAF images are inserted inside and outside the two gate lines in accordance with the above stated principles.

FIGS. 10a through 10c show in top view:
- 76, FIG. 10a, the image on the surface of the packed mask; FSAF images 83 has been placed between two desired features 82, two additional FSAF patterns 81 have been added to the outside of two desired features 82, additional FSAF patterns 85 has been added to the outside of the desired feature 88
- 78, FIG. 10b, the image on the surface of the unpacking mask; unpacking images 84, 86 and 90 have been provided in the surface of the unpacking mask 78; unpacking images 84, 86 and 90 of unpacking mask 78 align with FSAF patterns 81, 85 and 83 respectively provided on the packed mask 76
- 80, FIG. 10c, the final image that is created by first exposing with the packed mask 76, after which the same surface is exposed with the unpacking mask 78; this exposure with the unpacking mask 78 is performed such that the unpacking images 84, 86 and 90 are aligned with the images 81, 85 and 83 respectively of the packed mask 76. This allows patterns 81, 85 and 83 of image 78 to maximize the contribution to spatial frequency and to achieve unification of the exposure level of the desired feature, that is the final image 82 and 88 shown in top view in image 80.

Figure 11C:
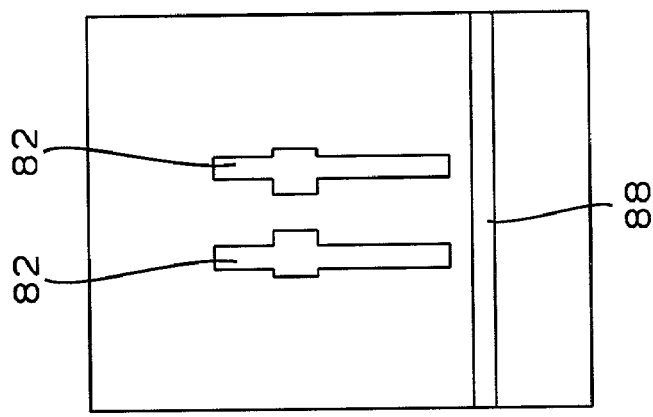
FIGS. 11a through 11c show a top view of the PAR implementation, applied to second two-dimensional features.
Figure 11B:
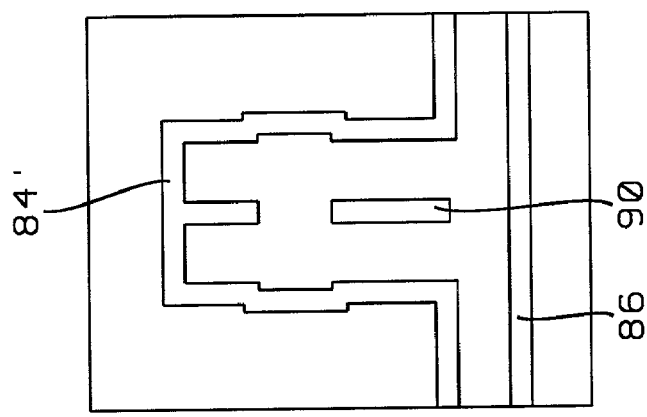
Figure 11A:
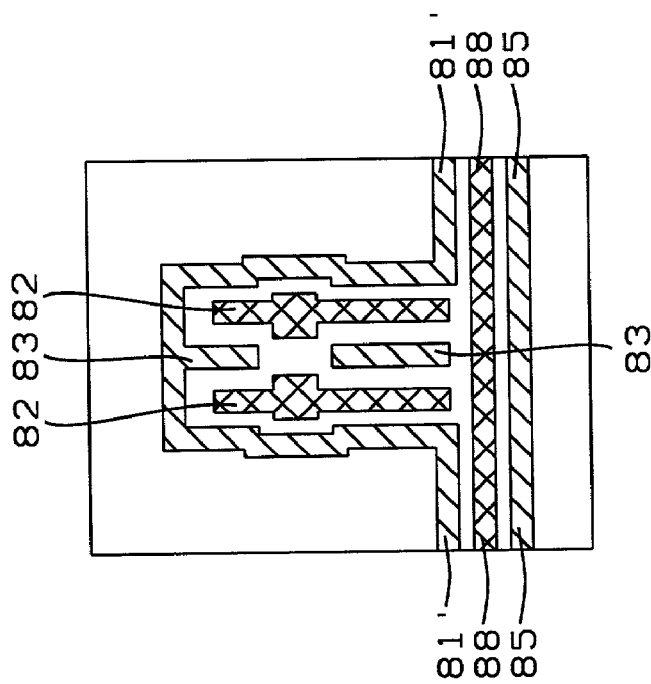

FIGS. 11a through 11c show a top view of the PAR implementation, applied to second two-dimensional features. FIGS. 11a through 11c show the same images as those that have been shown in the preceding FIGS. 10a through 10c, with the exception of patterns 81' and 84', which in FIGS. 11a through 11c take the place of patterns 81 and 84 respectively of FIGS. 10a through 10c. An additional horizontal bar has been added to the FSAF pattern 81'/84' of exposures 76 and 78 respectively. The use of this additional horizontal bar can experimentally be determined by evaluating optimum imaging performance for the ends of polysilicon lines 82 that are closest to this additional horizontal bar.

It must be pointed out that the invention does not impose a limit on the number of FSAF images that are provided, just as long as there is sufficient surface area available to create these FSAF images thereover.

FIG. 12 shows a top view of two packing features per side, as applied in the top view shown in FIGS. 2a through 2c. FIG. 12 shows a top view that is an extension of the top view that has been shown in FIGS. 2a through 2c, the FSAF packing images 17 of FIGS. 2a through 2c have been expanded to two packing images 17' and 17".

FIG. 13 shows a top view that is an extension of the top view that has been shown in FIG. 12, the FSAF packing image 85 of FIG. 12 has been expanded to two packing images 85' and 85", the FSAF packing image 81' of FIG. 12 has been expanded to two packing images 81' and 81".

FIGS. 14a through 14c show a top view of an unpacking mask, required for the desired features as shown in top view in FIGS. 1a through 1c. Specifically highlighted in FIG. 14b is a different way to create a layout of the unpacking mask, as follows:
- 91 are the Full Size Assist Features (FSAF)
- 93 is the desired feature
- 95 is the layout of the unpacking feature
- 97 shows the final feature.

The mask is a light-field mask, the features 95 of the unpacking mask are similar to and slightly larger than the desired features 97.

The following comments apply to the creation of the packed and the unpacking mask of the invention. After creating the packed mask, an unpacking mask is created by repeating the FSAF image and by making each of these images slightly larger (on the unpacking mask) in order to compensate for overlay errors that may occur during the second exposure, that is the exposure of the unpacking mask. For exposures of positive photoresist, the packed mask may be a light-field mask comprising opaque surface regions for the desired features and for the FSAF images. The corresponding unpacking mask is then a dark field mask, comprising transparent surface regions for the FSAF images. Using these masks and performing first an exposure with the packed mask and second an exposure of the same surface of photoresist with the unpacking mask, photoresist features that correspond to the desired features will be created. It must thereby be pointed out that the sequence of exposure is not important and can be reversed from the sequence indicated. By using negative photoresist, the indicated combination of mask polarities creates trench type features in layer of photoresist. This latter type of photoresist image is applicable in cases where the circuit features are delineated by an additive process such as plating or lift-off as opposed to a subtractive process such as etching.

Although the invention has been described and illustrated with reference to specific illustrative embodiments thereof, it is not intended that the invention be limited to those illustrative embodiments. Those skilled in the art will recognize that variations and modifications can be made without departing from the spirit of the invention. It is therefore intended to include within the invention all such variations and modifications which fall within the scope of the appended claims and equivalents thereof.

What is claimed is:

1. A method for creating a pattern upon a substrate, comprising the steps of:
   providing a substrate, said substrate having been provided with a masking layer;
   first exposing said masking layer with a first mask, said first mask comprising a first and a second pattern, said first pattern being a pattern of semiconductor device features having a first geometry, said second pattern being full-size assist features having a second geometry;
   second exposing said masking layer with a second mask, said second mask comprising a third pattern, said third pattern aligning with said second pattern on said first mask; and
   developing said masking layer in accordance with said first and second exposure of said masking layer.

2. The method of claim 1, said third pattern having dimensions being larger than dimensions of said second pattern by a measurable amount.

3. The method of claim 1, a distance between elements of said full-size assist feature and elements of said semiconductor device features being within a range of 0.5 and 3.0 times said geometry of said semiconductor device features.

4. The method of claim 1, said first geometry being about equal to said second geometry.

5. The method of claim 4, a design of said full-size assist feature being determined in accordance with a second equation, said second equation having independent parameters, said independent parameters being dimensions of said semiconductor device features, said second equation having as objective maximization of said contribution to spatial frequency and to achieving unification of an exposure level of the device features by said full-size assist features, thereby assuring optimum imaging performance.

6. The method of claim 1, a distance between elements of said full-size assist feature and elements of said semiconductor device features being determined in accordance with a first equation, said first equation having independent parameters, said independent parameters being dimensions of said semiconductor device features, said first equation having as objective maximization of said contribution to spatial frequency and to achieving unification of an exposure level of the device features by said full-size assist features, thereby assuring optimum imaging performance.

7. The method of claim 1, said masking layer comprising photoresist.

8. The method of claim 1, said masking layer comprising an insulating material.

9. The method of claim 1, said first and said second pattern comprising an opaque surface region of said first mask surrounded by a transparent background surface region.

10. The method of claim 1, said first and said second pattern comprising a transparent surface region of said first mask surrounded by an opaque background surface region.

11. The method of claim 1, said third pattern comprising an opaque surface region of said first pattern surrounded by a transparent background surface region.

12. The method of claim 1, said third pattern comprising a transparent surface region of said first pattern surrounded by an opaque background surface region.

13. The method of claim 1 wherein overlapping full-size assist features of said second pattern of full-size assist features are combined into larger full-size assist features.

14. The method of claim 1 wherein said second pattern comprises side-by-side full-size assist features.

15. The method of claim 1, said third pattern being aligned with said first pattern, keying said third pattern to said first pattern.

16. The method of claim 1, elements of said second pattern being interspersed with elements of said first pattern.

17. The method of claim 1, elements of said second pattern surrounding elements of said first pattern.

18. The method of claim 1, wherein said second pattern comprises full-size assist features and small-size assist features.

19. The method of claim 1, said full-size assist features being designed to maximize contribution to spatial frequency and to achieve unification of an exposure level of the device features.

20. A packing and unpacking mask for creating a closely spaced pattern over a substrate, comprising:
   a first mask comprising a first and a second pattern, said first pattern being a pattern of semiconductor device features having a first geometry, said second pattern being full-size assist features having a second geometry, said full-size assist features being designed to maximize contribution to spatial frequency and to achieve unification of an exposure level of the semiconductor device features; and
   a second mask comprising a third pattern, said third pattern aligning with said second pattern on said first mask.

21. The packing and unpacking mask of claim 20, said third pattern having dimensions being larger than dimensions of said second pattern by a measurable amount.

22. The packing and unpacking mask of claim 20, a distance between elements of said full-size assist feature and elements of said semiconductor device features being within a range of 0.5 and 3.0 times said geometry of said semiconductor device features.

23. The packing and unpacking mask of claim 20, said first geometry being about equal to said second geometry.

24. The packing and unpacking mask of claim 20, a distance between elements of said full-size assist feature and elements of said semiconductor device features being determined in accordance with a first equation, said first equation having independent parameters, said independent parameters being dimensions of said semiconductor device features, said first equation having as objective maximization of said contribution to spatial frequency and to achieving unification of an exposure level of the semiconductor device features by said full-size assist features, thereby assuring optimum imaging performance.

25. The packing and unpacking mask of claim 20, a design of said full-size assist feature being determined in accordance with a second equation, said second equation having independent parameters, said independent parameters being dimensions of said semiconductor device features, said second equation having as objective maximization of said contribution to spatial frequency and to achieving unification of an exposure level of the semiconductor device features by said full-size assist features, thereby assuring optimum imaging performance.

26. The packing and unpacking mask of claim 20, said first and said second pattern comprising an opaque surface region of said first mask surrounded by a transparent background surface region.

27. The packing and unpacking mask of claim 20, said first and said second pattern comprising a transparent surface region of said first mask surrounded by a opaque background surface region.

28. The packing and unpacking mask of claim 20, said third pattern comprising an opaque surface region of said first pattern surrounded by a transparent background surface region.

29. The packing and unpacking mask of claim 20, said third pattern comprising a transparent surface region of said first mask surrounded by an opaque background surface region.

30. The packing and unpacking mask of claim 20 wherein overlapping full-size assist features of said second pattern of full-size assist features are combined into larger full-size assist features.

31. The packing and unpacking mask of claim 20 wherein said second pattern comprises side-by-side full-size assist features.

32. The packing and unpacking mask of claim 20, said third pattern being aligned with said first pattern, keying said third pattern to said first pattern.

33. The packing and unpacking mask of claim 20, elements of said second pattern being interspersed with elements of said first pattern.

34. The packing and unpacking mask of claim 20, elements of said second pattern surrounding elements of said first pattern.

35. The method of claim 20, wherein said second pattern comprises full-size assist features and small-size assist features.

* * * * *